(12) United States Patent
Chen et al.

(10) Patent No.: US 7,688,872 B2
(45) Date of Patent: Mar. 30, 2010

(54) SELF-CALIBRATING INTEGRATED PHOTONIC CIRCUIT AND METHOD OF CONTROL THEREOF

(75) Inventors: Young-Kai Chen, Berkeley Heights, NJ (US); Mahmoud Rasras, Berkeley Heights, NJ (US); Kun-Yii Tu, Califon, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 0 days.

(21) Appl. No.: 12/050,225

(22) Filed: Mar. 18, 2008

(65) Prior Publication Data

US 2009/0238557 A1    Sep. 24, 2009

(51) Int. Cl.
*H01S 3/13* (2006.01)
(52) U.S. Cl. ............... 372/29.01; 372/29.02; 372/33
(58) Field of Classification Search ........... 372/29.01, 372/29.02
See application file for complete search history.

(56) References Cited

U.S. PATENT DOCUMENTS

| 6,175,579 | B1 * | 1/2001 | Sandford et al. ........... 372/32 |
| 7,324,716 | B2 * | 1/2008 | Epitaux ................. 385/14 |
| 2002/0041611 | A1 * | 4/2002 | May ................... 372/29.02 |
| 2002/0126367 | A1 | 9/2002 | Kuwahara et al. |

FOREIGN PATENT DOCUMENTS

| EP | 1959589 A1 | 8/2008 |
| JP | 61-30088 | 2/1986 |
| JP | 63-151091 | 6/1988 |
| JP | 3-91981 | 4/1991 |
| WO | 00/45213 | 3/2000 |
| WO | 0045213 A1 | 8/2000 |
| WO | 2005/122346 A2 | 12/2005 |

OTHER PUBLICATIONS

Danko, J.; "Integrated optic Diode Laser Stabilizer"; SPIE vol. 1141 5th European Conference on Integrated Optics: ECIO '89; XP 000088949; pp. 52-58.
PCT Search Report for PCT/US2009/001700; dated Jul. 2, 2009; 5 pages.
* cited by examiner

*Primary Examiner*—Dung T Nguyen
(74) *Attorney, Agent, or Firm*—Hitt Gaines, PC

(57) ABSTRACT

A self-calibrating integrated photonic circuit and a method of controlling the same. In one embodiment, the circuit includes: (1) a substrate, (2) a laser located on the substrate and configured to produce source light at an output frequency, (3) a laser alignment sensor located on the substrate and including: (3a) a reference optical resonator configured to receive the source light, have a null proximate a predetermined center frequency and provide output light as a function of a relationship between the output frequency and the center frequency and (3b) a photodetector configured to provide an electrical signal of a magnitude that is based on the output light and (4) a calibration controller located on the substrate, coupled to the photodetector and configured to adjust the output frequency based on the magnitude.

20 Claims, 7 Drawing Sheets

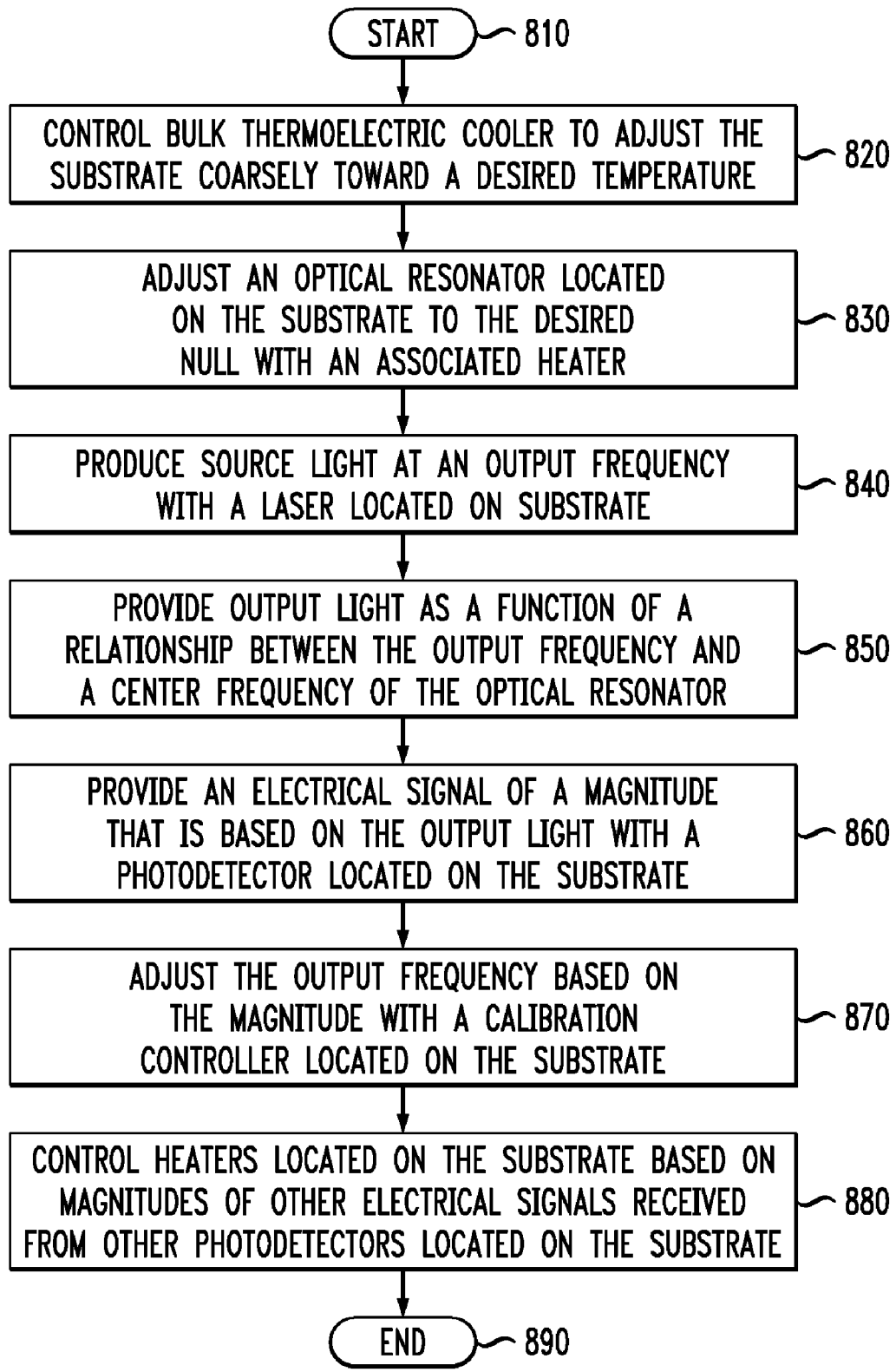

SELF-CALIBRATING INTEGRATED PHOTONIC CIRCUIT AND METHOD OF CONTROL THEREOF

TECHNICAL FIELD OF THE INVENTION

The invention is directed, in general, to integrated photonics and, more specifically, to a self-calibrating integrated photonic circuit and method of controlling such a circuit.

BACKGROUND OF THE INVENTION

This section introduces aspects that may help facilitate a better understanding of the invention. Accordingly, the statements of this section are to be read in this light and are not to be understood as admissions about what is, or what is not, prior art.

Systems employing integrated photonic circuits can provide powerful platforms for ultra-wide-band signal processing. Silicon-based integrated photonic circuits hold a particularly promising future for high level integration of photonic circuits. Unfortunately, such photonic circuits are subject to frequency drift and photonic device mismatches resulting from temperature changes. The drift and mismatches, called "misalignment," degrades the performance of the photonic circuits. To counteract this problem, elaborate calibration circuits have been developed as companion chips to the integrated photonic circuits. These calibration circuits have been generally effective at reducing misalignment overall, but still have difficulty providing compensation for larger misalignments.

SUMMARY OF THE INVENTION

To address the above-discussed deficiencies of the prior art, one aspect of the invention provides a self-calibrating integrated photonic circuit. In one embodiment, the circuit includes: (1) a substrate, (2) a laser located on the substrate and configured to produce source light at an output frequency, (3) a laser alignment sensor located on the substrate and including: (3a) a reference optical resonator configured to receive the source light, have a null proximate a predetermined center frequency and provide output light as a function of a relationship between the output frequency and the center frequency and (3b) a photodetector configured to provide an electrical signal of a magnitude that is based on the output light and (4) a calibration controller located on the substrate, coupled to the photodetector and configured to adjust the output frequency based on the magnitude.

Another aspect of the invention provides a method of controlling a self-calibrating integrated photonic circuit. In one embodiment, the method includes: (1) producing source light at an output frequency with a laser located on a substrate of the circuit, (2) providing output light as a function of a relationship between the output frequency and a center frequency of a reference optical resonator located on the substrate, (3) providing an electrical signal of a magnitude that is based on the output light with a photodetector located on the substrate and (4) adjusting the output frequency based on the magnitude with a calibration controller located on the substrate.

BRIEF DESCRIPTION OF THE DRAWINGS

For a more complete understanding of the invention, reference is now made to the following descriptions taken in conjunction with the accompanying drawings, in which:

FIG. 8 is a flow diagram of one embodiment of a method of controlling a self-calibrating integrated photonic circuit.

DETAILED DESCRIPTION OF ILLUSTRATIVE EMBODIMENTS

As described above, today's elaborate calibration circuits, which are located on chips that are separate from the integrated photonic circuits ("off-chip"), have difficulty providing compensation for larger misalignments. Even modern lasers are susceptible to significant drift, and temperature variations can materially affect the alignment of other photonic devices in photonic circuits. In addition to being less effective than desired, today's off-chip calibration circuits are also relatively complex, expensive and increase overall chip-count and assembly cost. What is needed is a better way to calibrate an integrated photonic circuit. What is needed is a way to make an integrated photonic circuit self-calibrating such that their performance is enhanced and off-chip calibration is no longer necessary.

Figure 1:
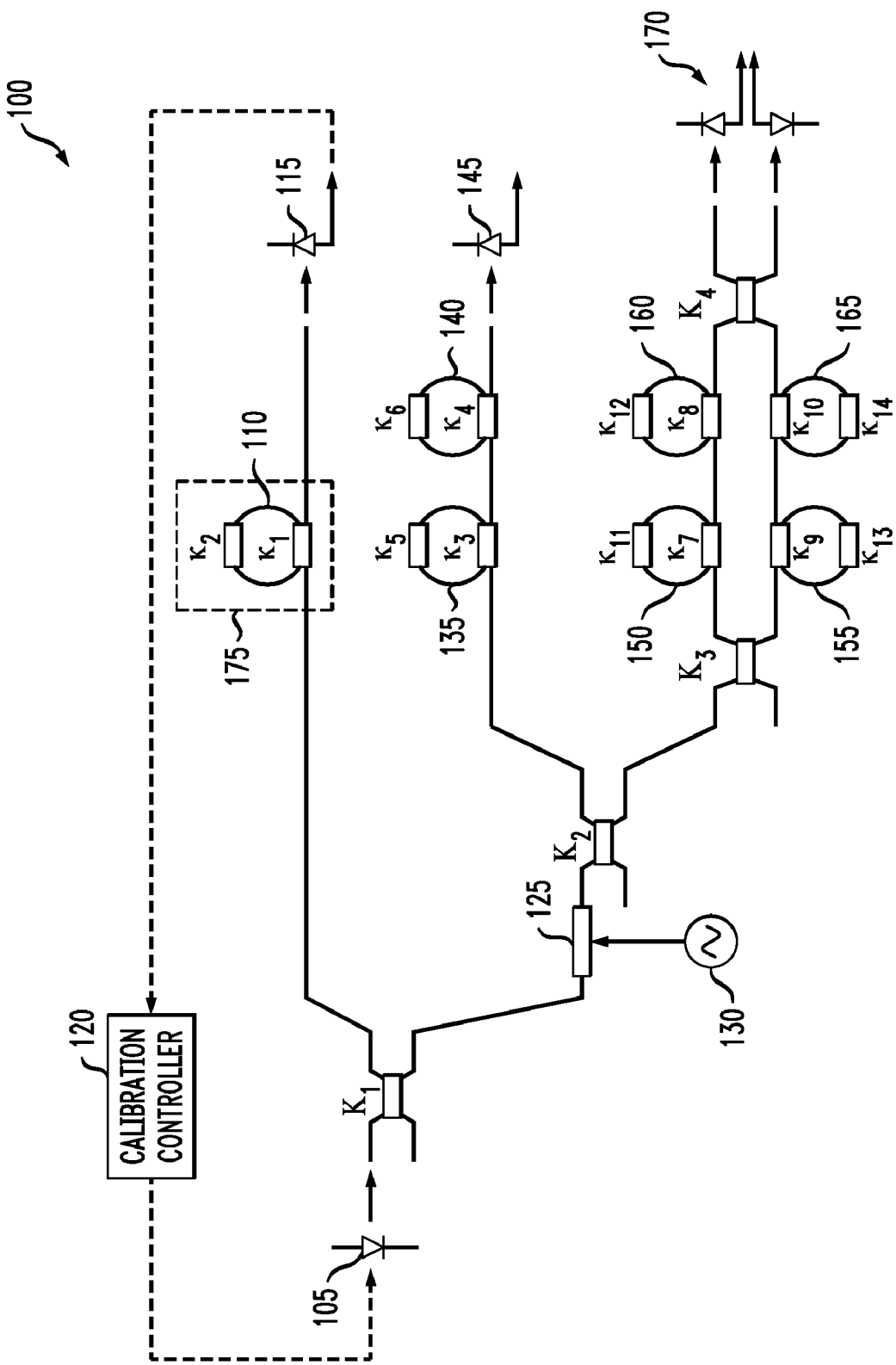
FIG. 1 is a diagram of one embodiment of a self-calibrating integrated photonic circuit.

FIG. 1 is a diagram of one embodiment of a self-calibrating integrated photonic circuit. All the photonic devices of the photonic circuit are located on (or in, the terms are used interchangeably herein) a single substrate 100. FIG. 1 shows a major face of the substrate, which may be regarded as an upper face of the photonic circuit. The substrate 100 is associated with a bulk thermoelectric cooler, or TEC (not shown in FIG. 1, but shown in FIG. 4B). In the illustrated embodiment, the bulk TEC is at least substantially coextensive with a major face of the substrate 100 (e.g., a lower face and therefore hidden from view in FIG. 1) and provides relatively coarse temperature control for the entire photonic circuit.

A laser 105 provides source light at an output frequency that is a function of one or more of temperature, drive current or a piezoelectric tuner setting if the laser 105 is equipped with a piezoelectric tuner. As described above, the output frequency drifts, usually as a result of changes in temperature.

A coupler $K_1$, which may be a Mach-Zehnder coupler, has first and second inputs and outputs and a heater and is configured to receive and split the source light into two paths. Optical waveguides (unreferenced) carry the source light along those two paths to further photonic devices. For simplicity's sake, FIG. 1 does not show the heaters associated with the coupler $K_1$ or other photonic devices. Those skilled in the pertinent art are familiar with such heaters, including how they are made and used.

One of those further photonic devices is a reference optical resonator 110. The reference optical resonator 110 may be a ring resonator, a disk resonator or any other conventional or later-developed resonator; the illustrated embodiment of the reference optical resonator 110 is a ring resonator. The reference optical resonator 110 has two couplers $k_1$, $k_2$ with associated heaters, an input and an output. The reference optical resonator 110 is configured to have a null at least proximate a predetermined center frequency, which may properly be regarded as a target frequency for the source light. Those skilled in the pertinent art understand how to make a reference optical resonator having a null at or proximate a desired center frequency. The reference optical resonator 110 is configured to receive the source light from the unreferenced waveguide and provide output light as a function of a relationship between the output frequency and the center frequency. That relationship will be explored in greater detail in FIG. 2.

A photodetector 115, which may be a photodiode), is configured to provide an electrical signal of a magnitude that is based on the output light. In the illustrated embodiment, the photodetector 115 is a photodiode, and the magnitude of the electrical signal it provides varies in terms of its current. However, the photodetector 115 may be of any other conventional or later-developed type. The reference optical resonator 110 and the photodetector 115 cooperate to form what will be referred to herein as a laser alignment sensor. As will be seen, the laser alignment sensor receives the source light and provides an electrical signal indicating at least whether or not the output frequency of the source light is aligned with respect to the predetermined center frequency and perhaps indicates the degree to which its output frequency may be misaligned. The illustrated embodiment of the laser alignment sensor provides the latter.

A calibration controller 120 is coupled to the photodetector 115. The calibration controller 120 is configured to adjust the output frequency of the laser 105 based on the magnitude (e.g., current) provided by the photodetector 115. In the illustrated embodiment, the calibration controller is embodied in a complementary metal-oxide semiconductor (CMOS) circuit, which those skilled in the art are aware may be placed on the same silicon substrate as the remainder of the photonic circuit. The calibration controller 120 controls the output frequency of the laser 105 as the photonic circuit is in operation by adjusting one or more of its temperature, its drive current or its piezoelectric tuner if so equipped. Assuming the calibration controller 120 is operating properly, the output frequency becomes and remains substantially aligned to the predetermined center frequency.

Recalling that optical waveguides (unreferenced) carry the source light from the coupler $K_1$ along two paths, the other path leads to an optical modulator 125 having an input and an output. The optical modulator 125 may have an associated heater. The optical modulator 125 is configured to modulate the source light using a signal provided by an oscillator 130. The output of the optical modulator 130, which is modulated source light, is provided to a coupler $K_2$, which may be a Mach-Zehnder coupler, has first and second inputs and outputs and a heater. The coupler 140 is configured to receive and split the modulated source light into two paths. Optical waveguides (unreferenced) carry the source light along those two paths to two filters, a notch filter and a bandpass filter, which represent typical elements of an optical processor that may be embodied in an integrated photonic circuit.

The notch filter includes first and second optical resonators 135, 140 having couplers $k_3$, $k_4$, and phase-shifters $k_5$, $k_6$ and associated heaters. A photodetector 145 is coupled to receive light from the output of the notch filter.

The bandpass filter includes a first coupler $K_3$, having first and second inputs, first and second outputs and a heater. The first coupler $K_3$ splits the modulated source light into upper and lower paths, as shown. The upper path has first and third optical resonators 150, 160 having couplers $k_7$, $k_8$ and phase-shifters $k_{11}$, $k_{12}$ and associated heaters. The lower path has second and fourth optical resonators 155, 165 having couplers $k_9$, $k_{10}$ and phase-shifters $k_{13}$, $k_{14}$ and associated heaters. A coupler $K_4$ having first and second inputs, first and second outputs and a heater, combines the upper and lower paths to yield two outputs. First and second photodetectors 170 are coupled to receive light from the outputs of the bandpass filter.

As will be described in greater detail, once the calibration controller 120 has aligned the output frequency of the laser 105, it may thereafter align various other photonic devices in the photonic circuit, including photonic devices in the notch and bandpass filter examples. In each case, the calibration controller 120 receives electrical signals from various photodetectors and controls various heaters located on the substrate 100 based on the magnitudes of those signals.

In the illustrated embodiment, while the optical resonators 135, 140, 150, 155, 160, 165 resonate at frequencies that are appropriate to their function in the photonic circuit, their designs are nonetheless based on the reference optical resonator 110. In other words, the optical resonators 135, 140, 150, 155, 160, 165 resonate at various offsets relative to the reference optical resonator 110, such that their reference frequencies can be calculated or expected. As a result, the output frequency of the laser 105 remains locked proximate or at $f_C$, and the photonic circuit remains stable as a whole when overall temperature deviations occur. An example of an optical resonator that resonates at an offset relative to a reference optical resonator will be set forth below.

Figure 2:
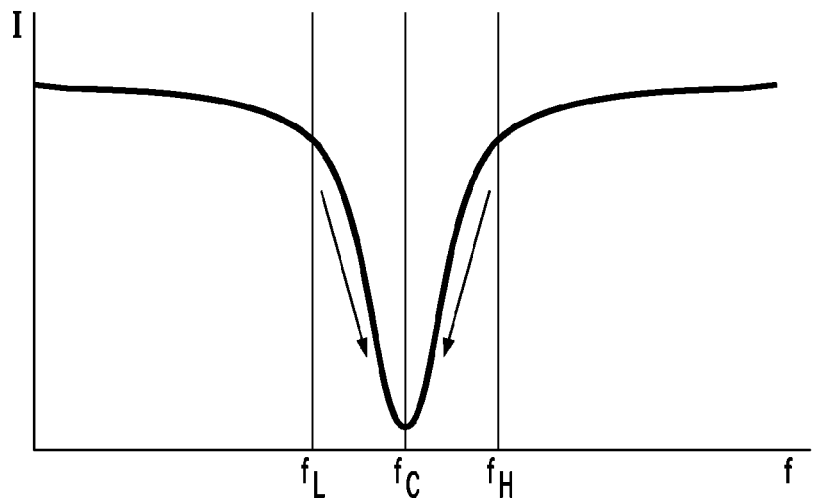
FIG. 2 is a graph of photodetector output current as a function of reference optical resonator source light frequency illustrating, in particular, the monotonic nature of the reference optical resonator response as a function of the output frequency of the source light.
Figure 3:
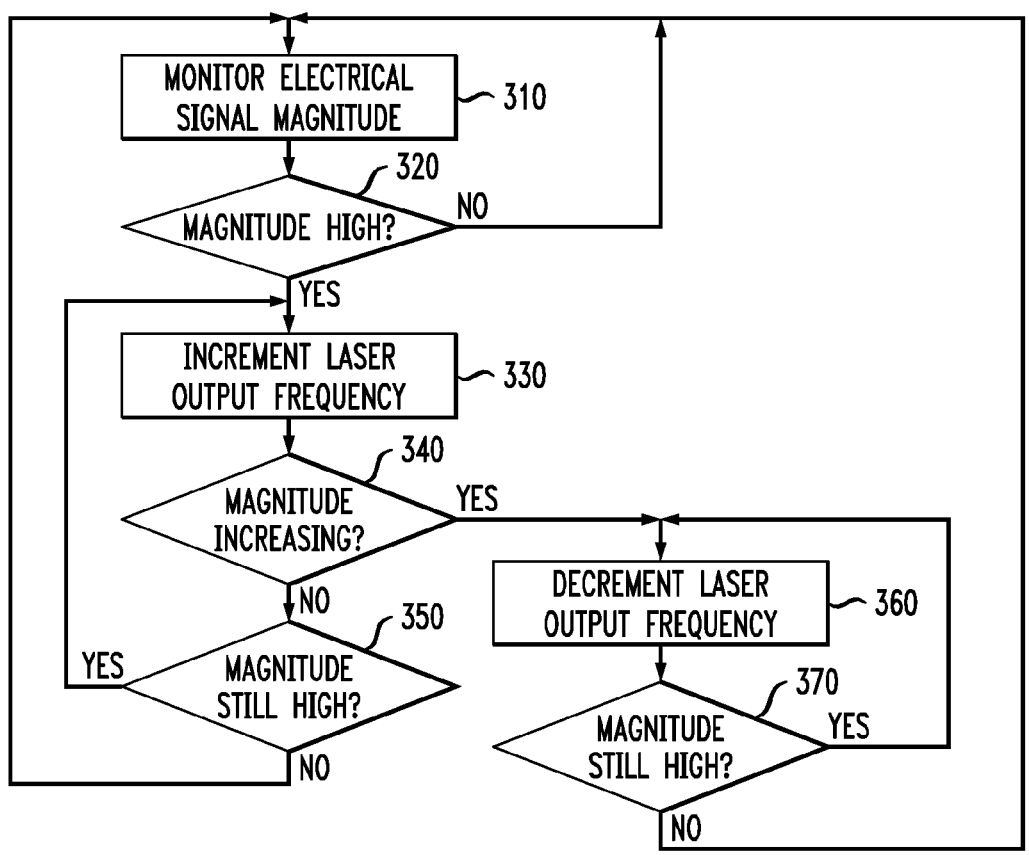
FIG. 3 is a flow diagram of one embodiment of a laser alignment process that may be carried out in the calibration controller of FIG. 1.

FIG. 2 is a graph of photodetector output current as a function of reference optical resonator source light frequency illustrating, in particular, the monotonic nature of the reference optical resonator response as a function of the output frequency of the source light. It can be seen that the magnitude (e.g., current, I) provided by the photodetector varies as a function of the output frequency, f, of the source light. It can also be seen that the magnitude exhibits a local minimum at $f_C$. However, the output frequency may drift toward either $f_L$ or $f_H$. Consequently, the magnitude increases, and the calibration controller 120 operates to adjust the output frequency back toward $f_C$ and the local minimum as the arrows in FIG. 2 show. FIG. 3 sets forth one way by which this alignment process may be carried out.

FIG. 3 is a flow diagram of one embodiment of a laser alignment process that may be carried out in the calibration controller of FIG. 1. In one embodiment, the laser alignment process of FIG. 3 is carried out after a bulk TEC associated with the photonic circuit is first controlled to adjust the substrate of the photonic circuit coarsely toward a desired temperature and then the reference optical resonator of the alignment sensor is finely adjusted to produce a desired null at the center frequency $f_C$ using the heater associated with the reference optical resonator. In one embodiment, the bulk TEC can control the temperature of the reference optical resonator to within 0.01° C. (equating to within 100 MHz accuracy for the null), and the heater associated with the reference optical resonator can control the temperature to within 0.0025° C. (equating to within 25 MHz accuracy). In another embodiment, a higher-accuracy temperature controller can control either or both of the bulk TEC and the heater to control the reference optical resonator temperature more tightly.

The magnitude of the electrical signal provided by the alignment sensor is monitored in a step 310. If the magnitude is high (decisional step 320), it is not yet known whether the output frequency is too low or too high. Arbitrarily assuming that the output frequency is too low, laser output frequency is incremented in a step 330, perhaps by changing the temperature or drive current of the laser or setting a piezoelectric tuner of the laser. If the magnitude does not increase (decisional step 340), the output frequency was in fact too low. If the magnitude is still high (decisional step 350), the output frequency is again incremented in the step 330 until the magnitude is no longer high (the decisional step 350). The magnitude then continues to be monitored for further misalignment in the step 310.

If, on the other hand, the magnitude increases as a result of the initial incrementing of the step 230, the output frequency was in fact too high, and the output frequency is decremented in a step 360, again perhaps by changing the temperature or drive current of the laser or setting a piezoelectric tuner of the laser. If the magnitude is still high (decisional step 370), the output frequency is again decremented in the step 360 until the magnitude is no longer high (the decisional step 370). The magnitude then continues to be monitored for further laser misalignment in the step 310.

Figure 4:
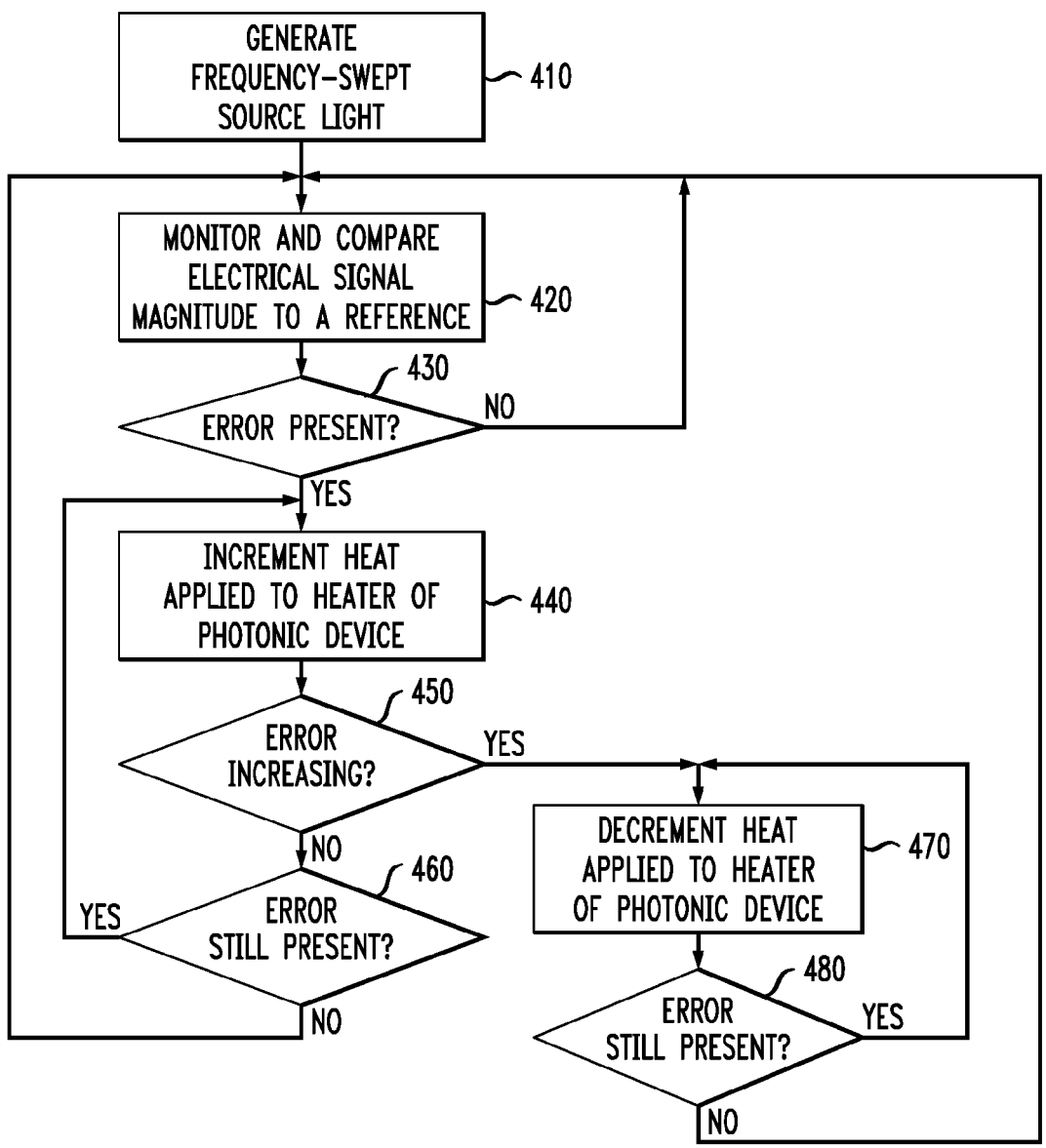
FIG. 4 is a flow diagram of one embodiment of a photonic device alignment process that may be carried out in the calibration controller of FIG. 1.

FIG. 4 is a flow diagram of one embodiment of a photonic device alignment process that may be carried out in the calibration controller of FIG. 1. In one embodiment, the photonic device alignment process of FIG. 4 is carried out after the laser alignment process of FIG. 3 has been carried out. In the illustrated embodiment, the photonic device alignment process of FIG. 4 is carried out with respect to the optical resonator 140 of FIG. 1 in order to align it with the unreferenced waveguide coupled to its input.

The magnitude of the electrical signal provided by the appropriate photodetector (i.e., the photodetector 145) is monitored and compared to a reference in a step 420. If an error is present (decisional step 430), it is not yet known whether the misalignment is due to the temperature of the optical resonator being too low or too high. Arbitrarily assuming that the temperature is too low, the temperature is incremented in a step 440. If the error does not increase (decisional step 450), the temperature was in fact too low. If the error is still present (decisional step 460), the temperature is again incremented in the step 440 until the error is no longer present (the decisional step 460). The magnitude then continues to be monitored for further misalignment in the step 420.

If, on the other hand, the error increases as a result of the initial incrementing of the step 440, the temperature was in fact too high, and the temperature is decremented in a step 470. If the error is still present (decisional step 480), the temperature is again decremented in the step 470 until the error is no longer present (the decisional step 480). The electrical signal then continues to be monitored and compared to the reference for further error in the step 420.

An alternative embodiment of the method of FIG. 4 employs the optical modulator 125 of FIG. 1 to generate a frequency-swept optical signal, which is used as a probe signal to detect and adjust for misalignments. In the alternative embodiment, a step 410, in which the frequency-swept optical signal is generated, precedes the monitoring and comparing step 420.

Figure 5:
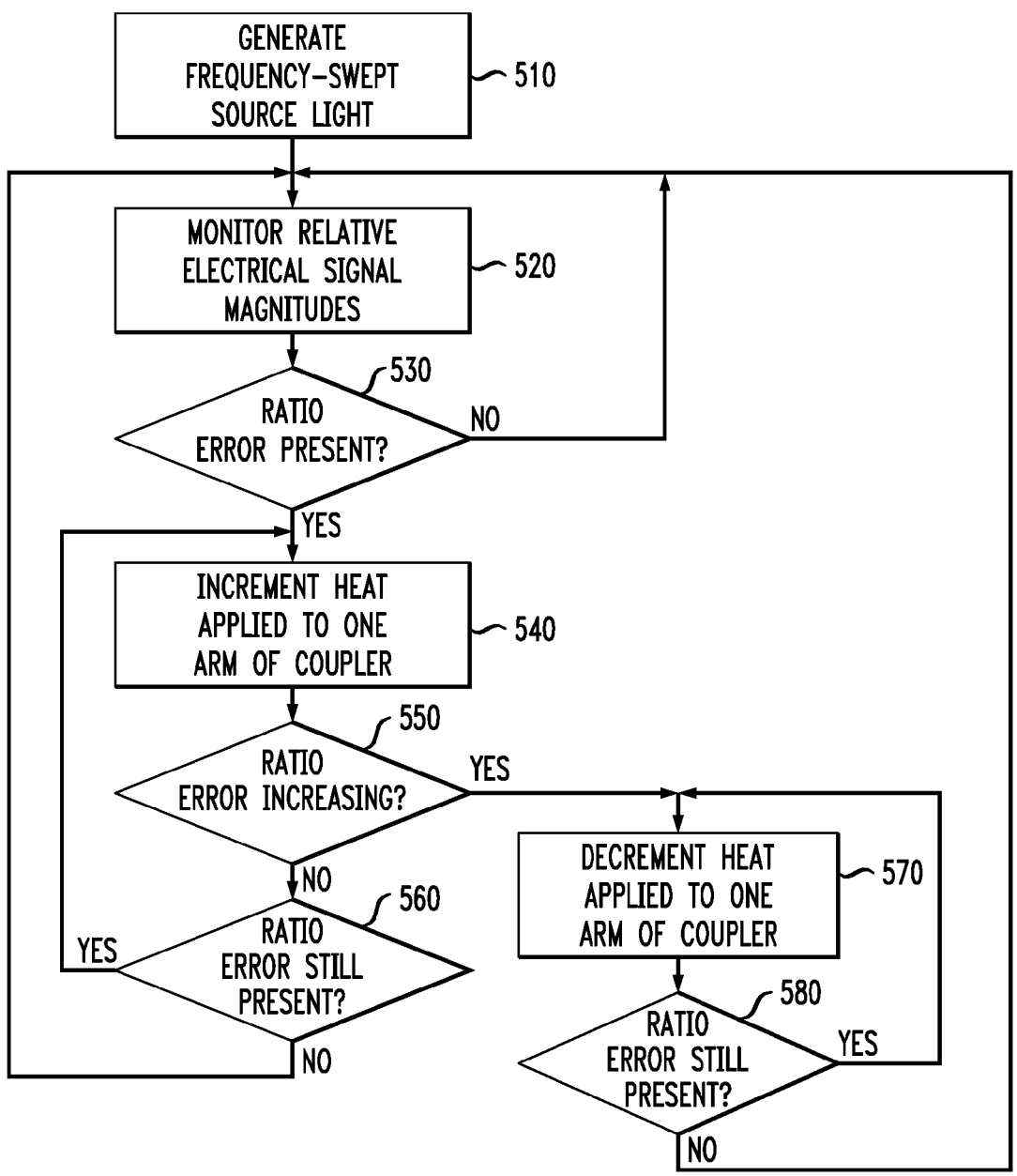
FIG. 5 is a flow diagram of one embodiment of a coupling ratio adjustment process that may be carried out in the calibration controller of FIG. 1.

FIG. 5 is a flow diagram of one embodiment of a coupling ratio adjustment process that may be carried out in the calibration controller of FIG. 1. In one embodiment, the coupling ratio adjustment process of FIG. 5 is carried out after the laser alignment process of FIG. 3 has been carried out. In the illustrated embodiment, the coupling ratio adjustment process of FIG. 5 is carried out with respect to the coupler $K_3$ of FIG. 1 in order to balance the upper and lower paths of the bandpass filter of FIG. 1.

The relative magnitudes of the electrical signals provided by the appropriate photodetectors (i.e., the first and second photodetectors 170) are monitored in a step 520. If a ratio error is present (decisional step 530), it is not yet known whether the ratio error can be reduced or eliminated by increasing or decreasing the temperature of one arm of the coupler. Arbitrarily assuming that the temperature should be increased, the temperature is incremented in a step 540. If the ratio error does not increase (decisional step 550), the temperature was in fact too low. If the ratio error is still present (decisional step 560), the temperature is again incremented in the step 540 until the ratio error is no longer present (the decisional step 560). The relative electrical signal magnitudes then continue to be monitored for further ratio errors in the step 520.

If, on the other hand, the ratio error increases as a result of the initial incrementing of the step 540, the temperature was in fact too high, and the temperature is decremented in a step 570. If the ratio error is still present (decisional step 580), the temperature is again decremented in the step 570 until the ratio error is no longer present (the decisional step 580). The relative electrical signal magnitudes then continue to be monitored for further ratio errors in the step 520.

An alternative embodiment of the method of FIG. 5 employs the optical modulator 125 of FIG. 1 to generate a frequency-swept optical signal, which is used as a probe signal to detect and adjust for ratio errors. In the alternative embodiment, a step 510, in which the frequency-swept optical signal is generated, precedes the monitoring step 520.

In practical applications, alignments and coupling ratio adjustments performed subsequent to laser alignment may make the temperature of the optical resonator 110 more difficult to control, which may ultimately degrade the performance of the integrated photonic circuit. Accordingly, turning back to FIG. 1, certain embodiments call for a trench 175 to be formed in the substrate 100 to provide a degree of thermal isolation to the optical resonator 110.

Figure 6A:
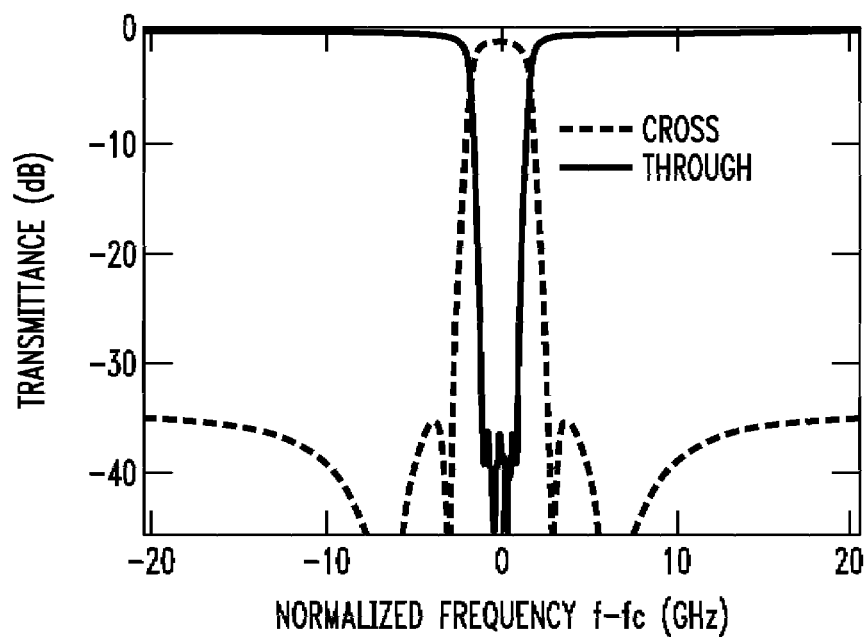
FIG. 6A is a graph of a response of an example pole-zero fourth-order bandpass filter.
Figure 6B:
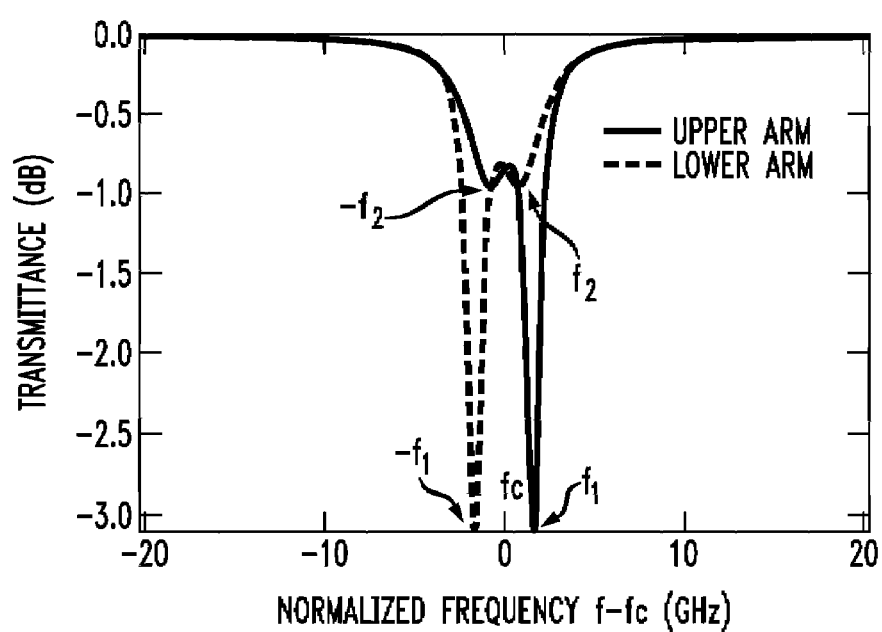
FIG. 6B is a graph of an optical resonator in the bandpass filter of FIG. 6A that resonates at an offset relative to a reference optical resonator.

An example of an optical resonator that resonates at an offset relative to a reference optical resonator will now be set forth. FIG. 6A is a graph of a response of an example pole-zero fourth-order bandpass filter, e.g., the bandpass filter of FIG. 1. As FIG. 6A shows, the bandpass filter is designed to have a passband centered about $f_C$. FIG. 6B is a graph of an optical resonator in the bandpass filter of FIG. 6A that resonates at an offset relative to a reference optical resonator. In the specific example of FIGS. 6A and 6B, the offset is zero, $f_C$=193.414 THz, $f_1$=1.67 GHz, and $f_2$=0.85 GHz.

Figure 7A:
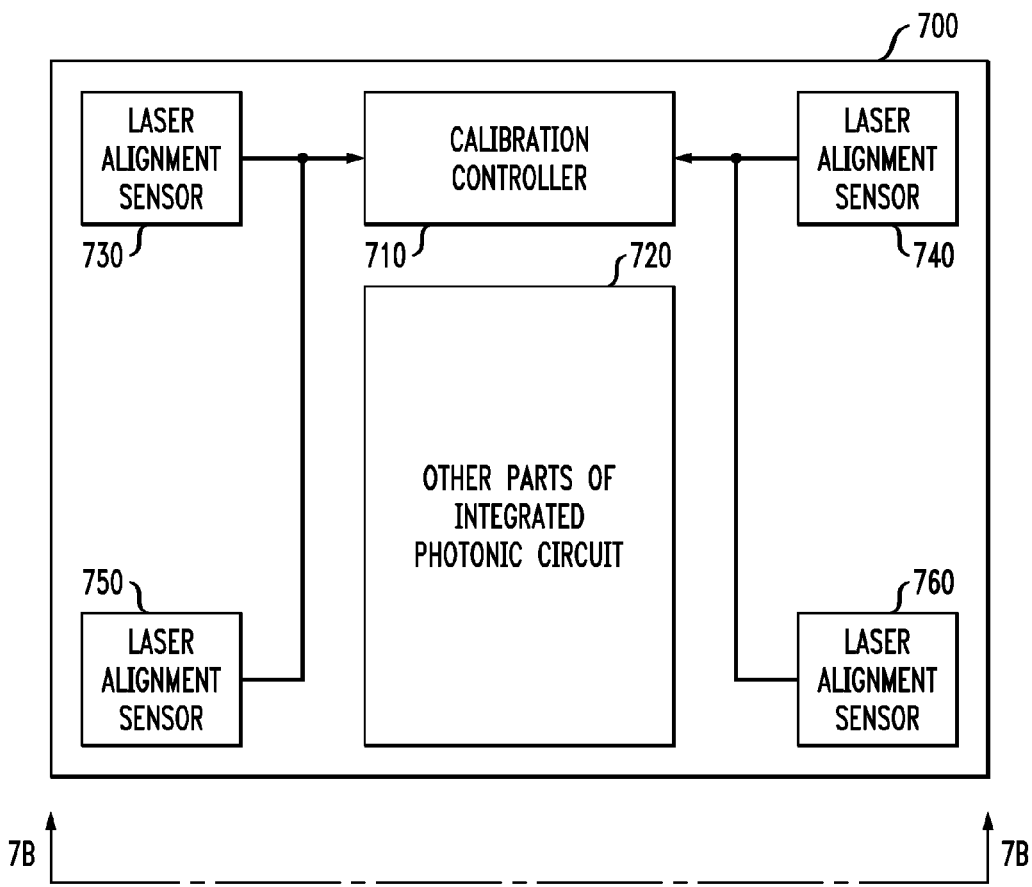
FIG. 7A is a plan view of one embodiment of a self-calibrating integrated photonic circuit having distributed laser alignment sensors.

In practical applications, the temperature of an integrated photonic circuit may vary over the major surface of its substrate. FIG. 7A is a plan view of one embodiment of a self-calibrating integrated photonic circuit having distributed laser alignment sensors. A substrate 700 not only supports a calibration controller 710 (which may be the same as, or different from, the calibration controller 120 of FIG. 1), but also other photonic device that together constitute other parts of the integrated photonic circuit 720.

Multiple laser alignment sensors 730, 740, 750, 760 are located on the substrate 700 and provide electrical signals to the calibration controller 710. The multiple laser alignment sensors 730, 740, 750, 760 are illustrated as being distal from one another such that the calibration controller 710 receives multiple indications of alignment over the area of the substrate 700. Consequently, the calibration controller 710 can take these multiple indications into account in adjusting misalignment by, e.g., averaging any misalignments indicated by the multiple laser alignment sensors 730, 740, 750, 760.

Figure 7B:
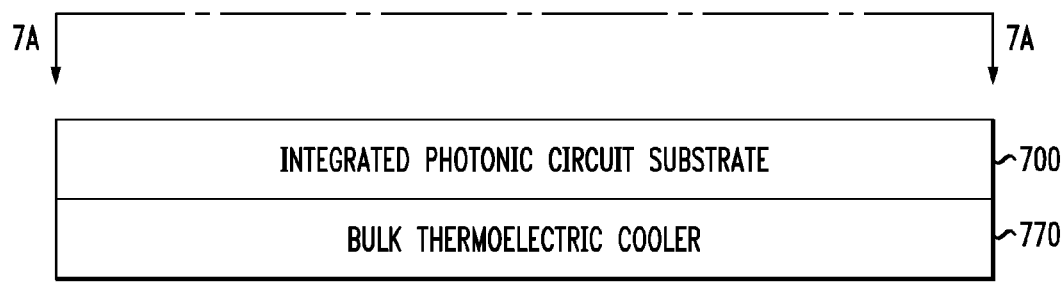
FIG. 7B is an elevational view of the photonic circuit of FIG. 7A.

FIG. 7B is an elevational view of the photonic circuit of FIG. 7A. FIG. 7B is presented primarily for the purpose of showing one embodiment of the photonic circuit in which a bulk thermoelectric device 770 spans an underside (i.e., major surface) of the substrate 700. As described above, the bulk thermoelectric device 770 serves to provide overall coarse temperature control for the substrate 700.

FIG. 8 is a flow diagram of one embodiment of a method of controlling a self-calibrating integrated photonic circuit. The method begins in a start step 810. In a step 820, a bulk TEC associated with the photonic circuit is controlled to adjust the substrate of the photonic circuit coarsely toward a desired temperature. The photonic circuit as a whole is now approximately temperature-calibrated. In a step 830, a reference optical resonator located on the substrate is finely adjusted to produce a desired null using a heater associated with the reference optical resonator. The reference optical resonator is now calibrated. In a step 840, source light is produced at an output frequency with a laser located on a substrate of the circuit. In a step 850, output light is provided as a function of a relationship between the output frequency and a center frequency of a reference optical resonator located on the substrate. In a step 860, an electrical signal of a magnitude that is based on the output light is provided with a photodetector located on the substrate. In a step 870, the output frequency is adjusted based on the magnitude with a calibration controller located on the substrate. The laser is now aligned with the reference optical resonator. In a step 880, heaters located on the substrate are controlled based on magnitudes of other electrical signals received from other photodetectors located on the substrate. At least some of the other photonic devices of the photonic circuit are now aligned. The method ends in an end step 890.

Those skilled in the art to which the invention relates will appreciate that other and further additions, deletions, substitutions and modifications may be made to the described embodiments without departing from the scope of the invention.

What is claimed is:

1. An apparatus, comprising:
 a self-calibrating integrated photonic circuit, said circuit including:
  a semiconductor substrate;
  a laser located on said substrate and configured to produce source light at an output frequency;
  a laser alignment sensor located on said substrate and including:
   a reference optical resonator configured to receive said source light, have a null proximate a predetermined center frequency and provide output light as a function of a relationship between said output frequency and said center frequency, and
   a photodetector configured to provide an electrical signal of a magnitude that is based on said output light; and
  a calibration controller located on said substrate, coupled to said photodetector and configured to adjust said output frequency based on said magnitude.

2. The apparatus as recited in claim 1 wherein said reference optical resonator is selected from the group consisting of:
 a ring resonator, and
 a disk resonator.

3. The apparatus as recited in claim 1 wherein said photodetector is a photodiode and said magnitude is a current level.

4. The apparatus as recited in claim 1 wherein said calibration controller is configured to adjust said output frequency by adjusting a selected one of:
 a temperature of said laser,
 a drive current of said laser, and
 a piezoelectric tuner of said laser.

5. The apparatus as recited in claim 1 wherein said substrate has a thermal isolation trench at least partially surrounding said reference optical resonator.

6. The apparatus as recited in claim 1 further comprising a bulk thermoelectric cooler that is at least substantially coextensive with a major face of said substrate.

7. The apparatus as recited in claim 1 further comprising:
 an optical modulator located on said substrate and configured to receive and modulate said source light to provide frequency-swept source light;
 a waveguide located on said substrate and configured to receive said frequency-swept source light;
 a photonic device located on said substrate, having a heater and configured to receive said frequency-swept source light from said waveguide and provide output light based thereon; and
 a further photodetector located on said substrate configured to provide an electrical signal of a magnitude that is based on said output light, said calibration controller further coupled to said further photodetector and configured to control said heater based on said magnitude to align said photonic device.

8. The apparatus as recited in claim 7 wherein said photonic device is part of a selected one of:
 a notch filter, and
 a bandpass filter.

9. The apparatus as recited in claim 1 further comprising:
 an optical modulator located on said substrate and configured to receive and modulate said source light to provide frequency-swept source light;
 a coupler located on said substrate, having first and second outputs and a heater and configured to receive said source light from said optical modulator and provide output light at said first and second outputs; and
 first and second further photodetectors located on said substrate, configured to provide first and second electrical signals of magnitudes that are based on said output light, said calibration controller further coupled to said first and second further photodetectors and configured to control said heater based on said magnitudes to adjust a coupling ratio of said coupler.

10. The apparatus as recited in claim 9 wherein said coupler is part of a bandpass filter.

11. A method of controlling a self-calibrating integrated photonic circuit, comprising:
 producing source light at an output frequency with a laser located on a semiconductor substrate of said integrated circuit;
 providing output light as a function of a relationship between said output frequency and a center frequency of a reference optical resonator located on said substrate;
 providing an electrical signal of a magnitude that is based on said output light with a photodetector located on said substrate; and adjusting said output frequency based on said magnitude with a calibration controller located on said substrate.

12. The method as recited in claim 11 wherein said reference optical resonator is selected from the group consisting of:
   a ring resonator, and
   a disk resonator.

13. The method as recited in claim 11 wherein said photodetector is a photodiode and said magnitude is a current level.

14. The method as recited in claim 11 wherein said adjusting comprises adjusting a selected one of:
   a temperature of said laser,
   a drive current of said laser, and
   a piezoelectric tuner of said laser.

15. The method as recited in claim 11 wherein said substrate has a thermal isolation trench at least partially surrounding said reference optical resonator.

16. The method as recited in claim 11 further comprising controlling a temperature of said substrate with a bulk thermoelectric cooler that is at least substantially coextensive with a major face of said substrate.

17. The method as recited in claim 11 further comprising:
   receiving and modulating said source light to provide frequency-swept source light with an optical modulator located on said substrate;
   receiving said frequency-swept source light into a waveguide located on said substrate;
   processing said frequency-swept source light received from said waveguide to provide output light based thereon with a photonic device located on said substrate and having a heater;
   providing an electrical signal of a magnitude that is based on said output light with a further photodetector located on said substrate; and
   controlling said heater based on said magnitude to align said photonic device.

18. The method as recited in claim 17 wherein said photonic device is part of a selected one of:
   a notch filter, and
   a bandpass filter.

19. The method as recited in claim 11 further comprising:
   receiving and modulating said source light to provide frequency-swept source light with an optical modulator located on said substrate;
   receiving said source light from said optical modulator into a coupler located on said substrate and having first and second outputs and a heater, said coupler providing output light;
   providing first and second electrical signals of magnitudes that are based on said output light with first and second further photodetectors located on said substrate; and
   controlling said heater based on said magnitudes to adjust a coupling ratio of said coupler.

20. The method as recited in claim 19 wherein said coupler is part of a bandpass filter.

* * * * *